United States Patent [19]

Pschunder

[11] Patent Number: 4,525,594
[45] Date of Patent: Jun. 25, 1985

[54] WAFER-SHAPED SOLAR CELL

[75] Inventor: Willi Pschunder, Ilsfeld, Fed. Rep. of Germany

[73] Assignee: Telefunken Electronic GmbH, Heilbronn, Fed. Rep. of Germany

[21] Appl. No.: 573,584

[22] Filed: Jan. 24, 1984

[30] Foreign Application Priority Data

Feb. 5, 1983 [DE] Fed. Rep. of Germany ....... 3303926

[51] Int. Cl.$^3$ ...................... H01L 31/04; H01L 31/18
[52] U.S. Cl. ..................................... 136/256; 136/244; 29/572; 29/583; 29/591
[58] Field of Search ................... 136/244, 256; 29/572, 29/583, 591

[56] References Cited

U.S. PATENT DOCUMENTS

| 3,493,437 | 2/1970 | Webb | 136/244 |
| 4,301,322 | 11/1981 | Amick | 136/256 |
| 4,393,576 | 7/1983 | Dahlberg | 29/572 |
| 4,401,840 | 8/1983 | Chitre | 136/258 |

FOREIGN PATENT DOCUMENTS

| 2757301 | 7/1979 | Fed. Rep. of Germany | 136/244 |
| 2919041 | 11/1980 | Fed. Rep. of Germany | 136/244 |
| 3237391 | 4/1983 | Fed. Rep. of Germany | 136/244 |

OTHER PUBLICATIONS

*Webster's New Collegiate Dictionary*, Merriam Co., Springfield, Mass., 1979, pp. 325-326.
Sonderdruck aus Raumfahrtforschung: "Neue Technologische Verfahren für Solarzellenanlagen", No. 5, Sep./Oct. 1979, pp. 205-211.

*Primary Examiner*—Aaron Weisstuch
*Attorney, Agent, or Firm*—Spencer & Frank

[57] ABSTRACT

The invention relates to a wafer-shaped solar cell comprising a rear side contact and a conduction path system as front side contact, with at least one metallic connector member connected to this conduction path system for interconnection of the solar cells with further solar cells. The crux of the invention is that the connector member or members are so connected at several spaced locations to the conduction path or paths in an electrically conductive and mechanically fixed manner that when the solar cell is split up into several smaller solar cells, each individual solar cell is already provided with at least one connector member protruding beyond the wafer edge.

16 Claims, 6 Drawing Figures 4,525,594

WAFER-SHAPED SOLAR CELL

BACKGROUND OF THE INVENTION

The invention relates to a wafer-shaped solar cell including a rear surface contact, and conduction paths on the surface which receives the incident light and to which at least one metallic connector member is connected for interconnection of the solar cell with further solar cells. The invention further relates to a process for manufacturing such a solar cell.

When single solar cells are assembled to form solar cell generators, the individual solar cells must be electrically connected in parallel or in series. To this end, the solar cells are provided, prior to assembly of the generator, with metallic connector members which are, for example, connected to the conduction path network on the semiconductor wafer surface receiving the incident light. These connector members are preferably comprised of band-shaped metal strips of, e.g. aluminum or copper. They are connected electrically and mechanically fixedly, at one end, to the conduction path network of the solar cell in such a manner that the free end of the connector member protrudes beyond the wafer edge and may, consequently, be electrically conductively connected to the connecting contact of a following solar cell.

SUMMARY OF THE INVENTION

The object underlying the invention is to provide a wafer-shaped solar cell from which smaller solar cells are obtainable, if required, and, at the same time, to rationalize the sequence of operations. This object is generally achieved according to the invention by a wafer-shaped solar cell of the above type wherein a connector member or members is or are so connected at several spaced points, in an electrically conductive and mechanically fixed manner to the conduction path or paths that when the solar cell is divided up into several smaller solar cells, each individual solar cell is already provided with at least one connector member which protrudes beyond the wafer edge.

According to the invention, a solar cell of large surface area is provided with metallic connector members which are suitable for interconnection of the solar cells of large surface area. At the same time, these connector members are, however, so constructed that on splitting the solar cell of large surface area into several smaller solar cells, each smaller solar cell, in turn, is provided with a suitable connector member which protrudes beyond the wafer edge and may be electrically conductively connected to the contact of another solar cell.

The invention covers several conceivable embodiments. The crux of the invention is that when the connector members are attached to the solar cell of large surface area, they are so arranged that, on splitting the semiconductor wafers at the possible points of separation, a connector member or a connector member portion protrudes beyond the wafer edge formed by the separation. It is, for example, possible to attach to the conduction paths numerous connector member portions which are arranged horizontally in one row and are connected to the conduction path at one end only. The detached end may then overlap in imbricated relationship the preceding connector member portion in the row. The detached end may, however, also only abut the preceding connector member portion in the row without overlapping it if the points of separation are so positioned that, after splitting of the semiconductor wafer, this detached end protrudes beyond the wafer edge.

BRIEF DESCRIPTION OF THE DRAWINGS

The invention and its further elaboration will now be more particularly described with reference to embodiments wherein.

DESCRIPTION OF THE PREFERRED EMBODIMENTS

Figure 1:
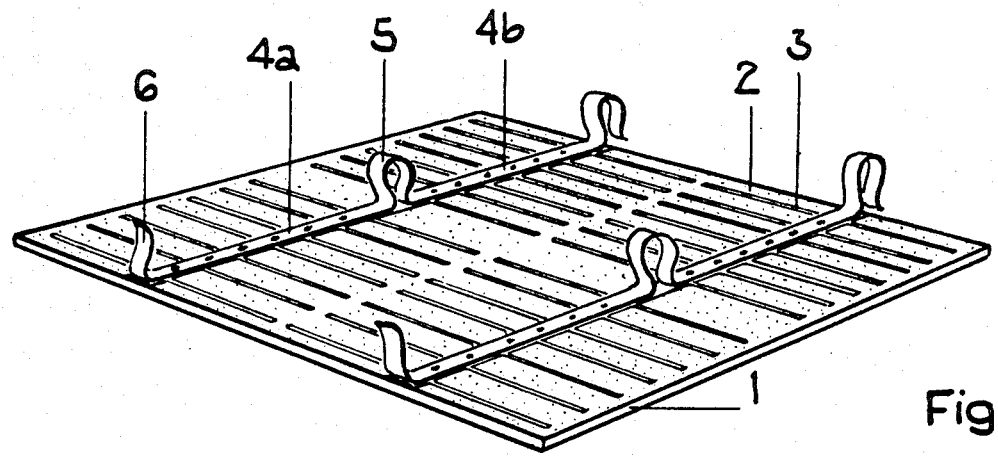
FIG. 1 shows a solar cell of large surface area with looped connector member projections provided at the points of separation.

FIG. 1 shows a solar cell 1 of large surface area with the surface 2 which receives the incident light. The rear side contact is disposed on the rear side of the cell, which is not visible in the drawing. Arranged on the surface 2 is a conduction path system 3, with center webs of widened configuration, to which the connector members 6 are connected. The connector members 6 are comprised, for example, of a thin metal band of aluminum, copper or silver-plated copper. These bands have a thickness of from approximately 50–100 μm and a width of from 2–3 mm. The bands are connected to the conduction path system, in an electrically conductive and mechanically fixed manner, at spaced points 4a and 4b. This connection may be made, for example, by soldering, adhesion, or welding. In the embodiment shown in FIG. 1, the connector members 6 protrude, in opposite directions, beyond the wafer edge and rise, in looped configuration, above the surface of the solar cell at points of separation provided between the connection points 4a and 4b. When the semiconductor wafer is divided up into single solar cells 8 and 9, in accordance with FIG. 3, loop 5 is severed in such a manner that each solar cell comprises a connector member 6a or 6b which extends beyond the wafer edge and may be electrically conductively connected to further solar cells.

Figure 2:
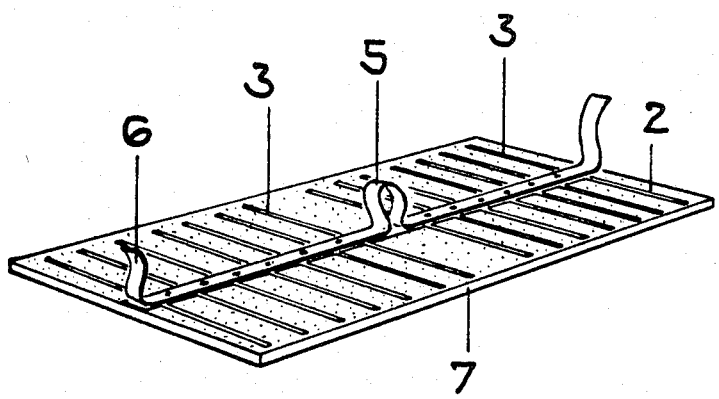
FIGS. 2 and 3 show the divided solar cell wafer.
Figure 3:
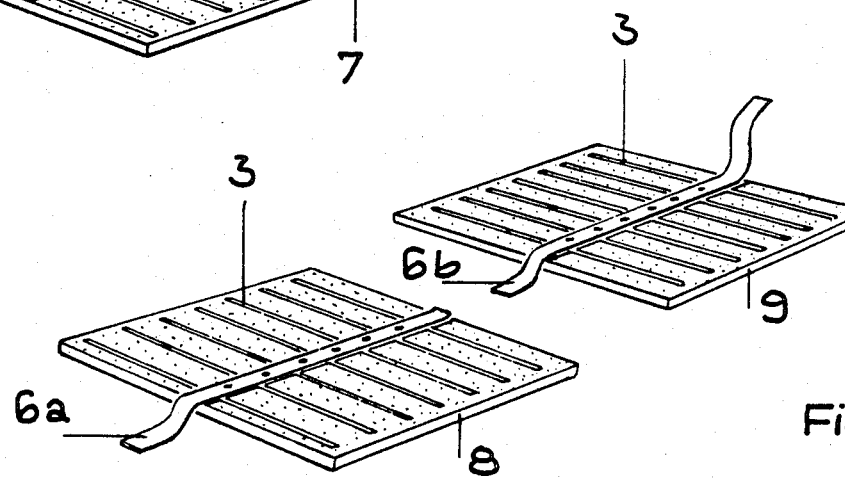

The solar cell shown in FIG. 1 may be used in the unsevered form. In this case, the loops 5 are preferably pressed flat. The solar cell according to FIG. 1 may, however, also be divided up into two solar cells as shown in FIG. 2 or into four solar cells as shown in FIG. 3. In each case, each solar cell is already provided with an electrical connector member.

Figure 4:
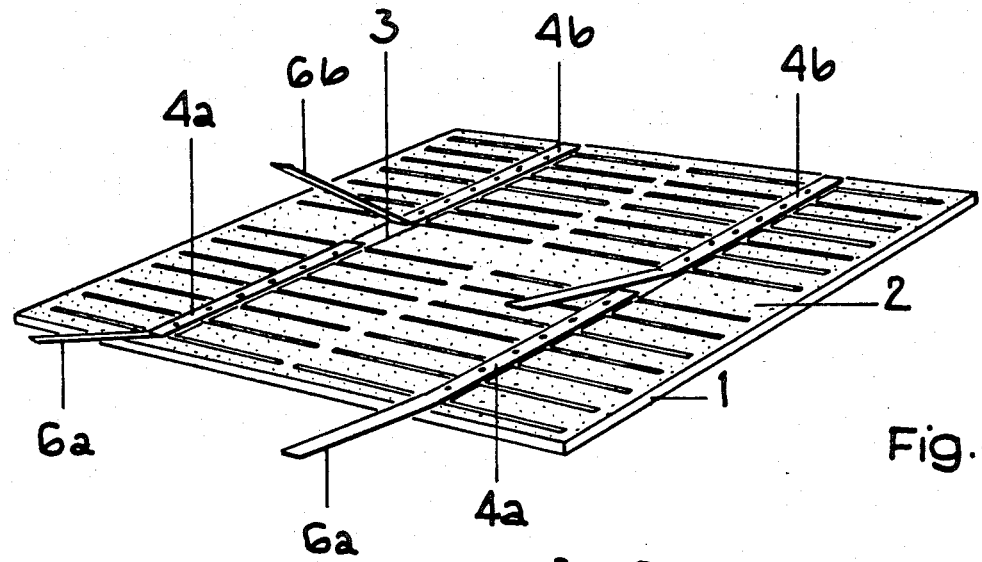
FIG. 4 shows a solar cell of large surface area with connector member portions arranged in imbricated relationship.

FIG. 4 shows a solar cell in which each connector member 6 is divided up into connector member portion 6a and 6b. Each connector member portion 6a or 6b is electrically and mechanically fixedly connected at the points 4a and 4b, respectively, to the conduction path system on the surface 2 of the solar cell. The free end of the connector member portion 6b overlaps the connector member portion 6a in imbricated relationship. It is, of course, also possible for more than two connector member portions to be arranged in one row; the number of connector member portions is determined by the maximum number of smaller solar cells obtainable from one wafer. The solar cell shown in FIG. 4 may now be severed at the surface points at which there is no connector member portion fixedly connected to the conduction path system. Since the arrangement shown in FIG. 4 comprises a solar cell with two parallel conduction path structures, this cell can be divided up into a maximum of four single solar cells, with each individual solar cell then having a connector member portion 6a or 6b protruding beyond the resulting wafer edge.

Figure 5:
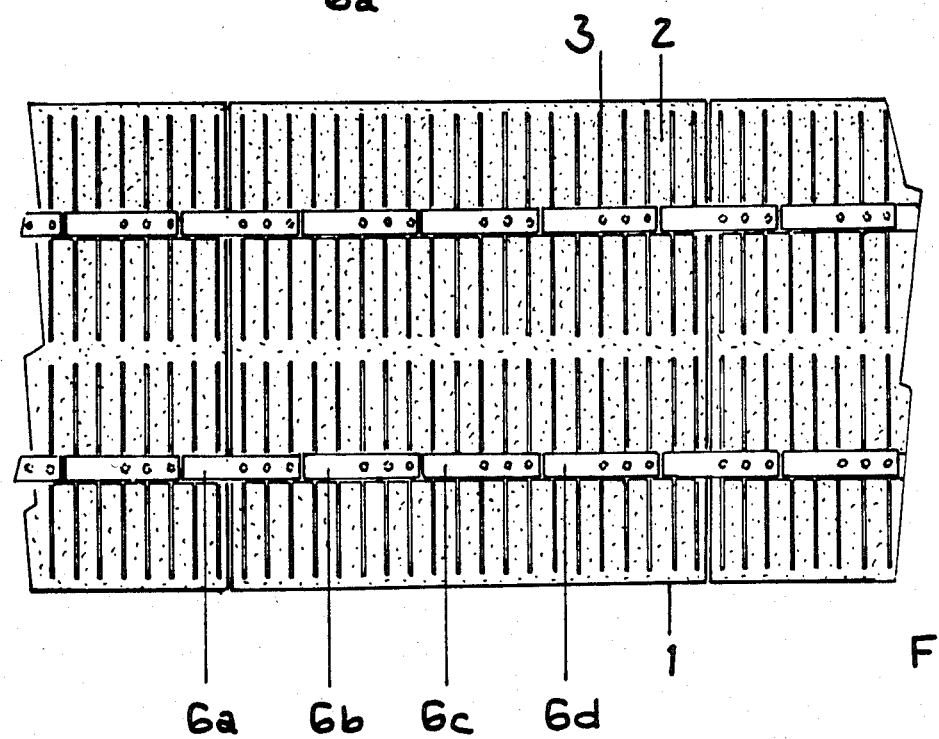
FIG. 5 shows an embodiment of the invention with connector member portions arranged in adjacent relationship.
Figure 6:
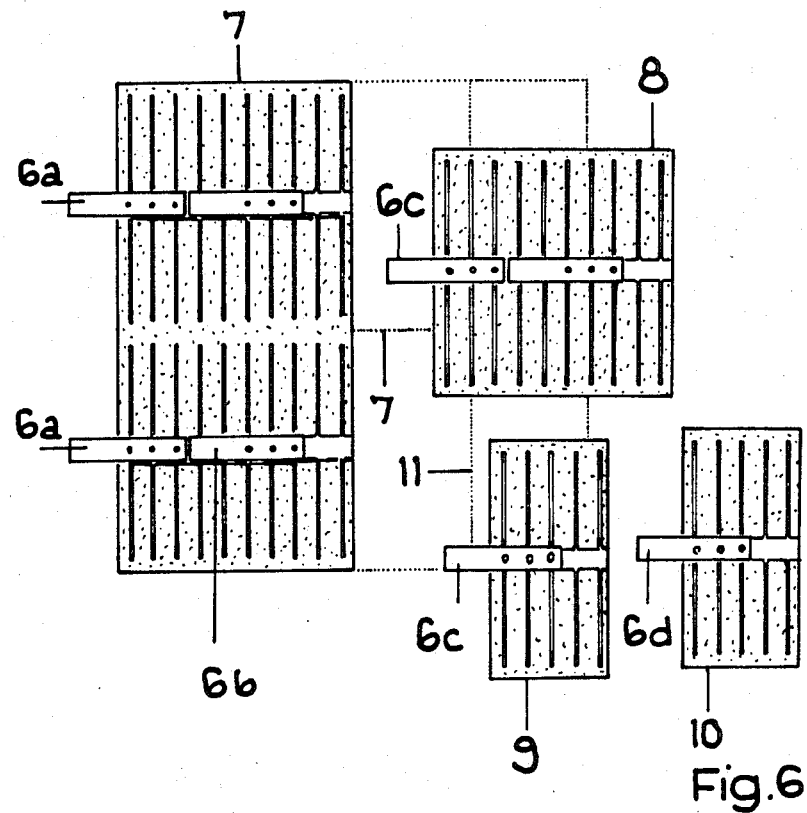
FIG. 6 shows the division of the solar cell according to FIG. 5 into single solar cells.

In the arrangement shown in FIG. 5, the connector member portions 6a and 6b, in accordance with FIG. 4, are replaced by four connector member portions 6a to 6d, respectively, which do, however, not overlap one another. The free end of each connector member portion abuts the end of the preceding connector member portion in the row that is fixedly connected to the conduction path. The separating lines 11 for division of the solar cell should then be positioned, in accordance with FIG. 6, so as to cut each individual connector member at the point between the part attached to the conduction path system and the part not attached to it. A solar cell such as that shown in FIG. 5, with the double conduction path system illustrated therein, can, therefore, be split up into a maximum of eight individual solar cells 9 and 10 as shown in FIG. 6. Division of the solar cell into four single solar cells 8 or into two single solar cells 7 is, however, also possible. In each case where a division is made, each single solar cell is already provided with one or with two connector members of band-shaped configuration which protrude beyond the wafer edge of the solar cell and act as means for connection to another solar cell, for example, to the rear side contact of the following cell in the solar generator.

The arrangement shown in FIGS. 5 and 6 may be employed for further rationalization of the manufacturing process. In this case, the connector members 6a to 6d are preferably secured to a foil. This foil is then attached to the disc surface, and the connector members 6a to 6d are connected to the conduction path system of the solar cell at the connection points provided. When the solar cell 1 is split up into individual solar cells 7 to 10, the order of the solar cells is at first maintained since the connector members remain adhered to the auxiliary foil used. The single solar cells can then be fully automatically removed from the foil. Such a foil is preferably of band-shaped configuration so that, in a conveyor belt process, solar cells arranged horizontally in one row, as indicated in FIG. 5, may be covered with the foil or sections of the foil, with the respective metallic connector members already adhering thereto. The foil is an adhesive foil, preferably a self-adhesive foil which must have apertures at the connection points so as to enable performance of the necessary welding or soldering process there. The foil is so attached to the semiconductor wafer that the connector member portions come into contact with the metallic conduction paths on the surface of the solar cell.

What is claimed is:

1. In a wafer-shaped semiconductor solar cell including a semiconductor wafer having a rear surface contact and conduction paths disposed on the surface of the solar cell wafer which receives the incident light and to which at least one metallic connector member is connected for interconnection of the solar cell with further solar cells, with said at least one connector member being connected, at several spaced points in an electrically conductive and mechanically fixed manner to said conduction paths; the improvement wherein a plurality of connector member portions which are arranged horizontally in one row are attached to said conduction paths, with each said connector member portion being secured to the conduction path at one end only, and having its detached end overlapping the preceding connector member portion in the row in imbricated relationship, whereby said solar cell can be divided into several smaller solar cells with each individual said smaller solar cell being already provided with at least one connector member protruding beyond the resulting wafer edge.

2. Solar cell according to claim 1, wherein the cutting points through the solar cells are so positioned that, after division of the semiconductor wafer, the single smaller solar cells obtained thereby each have at least one band-shaped connector member protruding beyond the edge of the resulting wafer.

3. In a wafer-shaped semiconductor solar cell including a semiconductor wafer having a rear surface contact and conduction paths disposed on the surface of the solar cell wafer which receives the incident light and to which at least one metallic connector member is connected for interconnection of the solar cell with further solar cells, with said at least one connector member being connected, at several spaced points in an electrically conductive and mechanically fixed manner to said conduction paths; the improvement wherein several connector member portions, which are arranged horizontally in one row, are attached to said conduction paths, with each said connector member portion being secured to the conduction path at one end only and having its detached end abutting the preceding connector member portion in the row without overlapping it, whereby said solar cell can be divided into several smaller solar cells with each individual said smaller solar cell being already provided with at least one connector member protruding beyond the resulting wafer edge.

4. Solar cell according to claim 3, wherein the cutting points through the solar cells are so positioned that, after division of the semiconductor wafer, the single smaller solar cells obtained thereby each have at least one band-shaped connector member protruding beyond the edge of the resulting wafer.

5. A method of manfacturing a solar cell, comprising:
   providing a semiconductor solar cell wafer having a contact on its rear surface and conduction paths on its surface which is to receive the incident light;
   connecting at least one band-shaped metallic connector member to said conduction paths at several spaced points in an electrically conductive and mechanically fixed manner such that said wafer can be divided into a plurality of smaller solar cells with each individual smaller solar cell being provided with at least one connector member protruding beyond the resulting wafer edge; and
   dividing said semiconductor wafer between said connection points to provide said plurality of smaller solar cells with said at least one protruding connector member.

6. A method of manufacturing a solar cell according to claim 5, wherein the connector members are of continuous configuration between the connection points and are separable between these connection points.

7. A method of manufacturing a solar cell according to claim 6, wherein the connector members protrude in opposite directions beyond the wafer edge.

8. A method of manufacturing a solar cell according to claim 6, wherein the connector members rise in looped configuration above the surface of the solar cell at the points of separation between the connection points with the conduction paths.

9. A method of manufacturing a solar cell according to claim 5, further comprising the steps of: prior to said step of connecting, securing the connector member or connector member portions to a foil, and attaching said foil with the secured connector member or connector member portions to the wafer surface so that said connector members or connector member portions contact the conduction paths at the connection points provided, whereby upon subsequent splitting of the wafer into smaller solar cells, the order of the individual smaller solar cells is maintained, even after division of the wafer, by the adhesion of the connector members to the unitary foil.

10. A method according to claim 9, wherein the foil is of band-shaped configuration and is designed for connection with a plurality of solar cells.

11. A method according to claim 10, wherein the foil has apertures at said connection points.

12. A method according to claim 9, wherein connector members of band-shaped Al, Ag, Cu, or silver-plated Cu are used, and these connector members are connected to the conduction paths of the solar cell by soldering, adhesive or welding.

13. A method according to claim 5 wherein said step of connecting includes providing a length of band-shaped connector member between said connecting points which is greater than the distance between said connecting points.

14. A method of manufacturing a solar cell as defined in claim 5 wherein said step of connecting includes providing a plurality of connector member portions which are arranged horizontally in one row, and securing only one end of each of said connector member portions to the conduction path while causing the detached end of each connector member portion to overlap the preceding connector member portion in the row in imbricated relationship.

15. A method of manufacturing a solar cell as defined in claim 5 wherein said step of connecting including providing a plurality of connector member portions which are arranged horizontally in one row with the ends of adjacent connector member portions abutting, and securing only one end of each connector member portion to the conduction path so that each connected end abuts a detached end of an adjacent connector member portion in the row without overlapping it.

16. A method of manufacturing a solar cell as defined in claim 15, further comprising the steps of: prior to said step of connecting, securing the connector member portions to a foil, and attaching said foil to the wafer surface so that said connector member portions contact the conduction paths at the connection points provided, whereby upon subsequent splitting of the wafer into smaller solar cells, the order of the individual smaller solar cells is maintained, even after division of the wafer, by the adhesion of the connector member portions to the foil.

* * * * *